United States Patent
Takeno et al.

(10) Patent No.: US 8,228,039 B2
(45) Date of Patent: Jul. 24, 2012

(54) BATTERY TESTING DEVICE AND BATTERY TESTING METHOD

(75) Inventors: Kazuhiko Takeno, Yokohama (JP); Takayuki Kanai, Yokohama (JP); Haruo Uemura, Kita-ku (JP)

(73) Assignee: NTT DoCoMo, Inc., Tokyo (JP)

( * ) Notice: Subject to any disclaimer, the term of this patent is extended or adjusted under 35 U.S.C. 154(b) by 439 days.

(21) Appl. No.: 12/335,944

(22) Filed: Dec. 16, 2008

(65) Prior Publication Data

US 2009/0160403 A1   Jun. 25, 2009

(30) Foreign Application Priority Data

Dec. 19, 2007   (JP) .................................. 2007-327661

(51) Int. Cl.
*H02J 7/00* (2006.01)
(52) U.S. Cl. ........................................................ 320/136
(58) Field of Classification Search .................. 320/124, 320/127–136; 324/427
See application file for complete search history.

(56) References Cited

U.S. PATENT DOCUMENTS

2007/0145949 A1* 6/2007 Matsushima et al. ......... 320/132

FOREIGN PATENT DOCUMENTS

| CN | 200972879 Y | 11/2007 |
|---|---|---|
| JP | 8-136600 | 5/1996 |
| JP | 8-189954 | 7/1996 |
| JP | 8-190938 | 7/1996 |
| JP | 2003-9406 | 1/2003 |
| JP | 2003-282150 | 10/2003 |
| JP | 2007-292654 | 11/2007 |

OTHER PUBLICATIONS

Matsushima et al., Residual Capacity Estimation of Stationary Lithium-ion Secondary Cells in Telecommunications Systems Using a Brief Discharge, 28th Annual International Telecommunications Energy Conference, pp. 1-7, Sep. 2006.*
R. Dueber, Tests Prove the Safety of Silver-Zinc Battery Technology over Lithium-Ion, pp. 1-9, dated Jul. 2007.*

(Continued)

*Primary Examiner* — Melissa Koval
*Assistant Examiner* — Daniel Miller
(74) *Attorney, Agent, or Firm* — Oblon, Spivak, McClelland, Maier & Neustadt, L.L.P.

(57) ABSTRACT

The present invention applies load to a portable telephone by charging and discharging a secondary battery conforming to the actual way of use of the portable telephone, so that the performance of the secondary battery in a portable telephone connected for charging can be accurately tested. A battery testing device of the present invention has: a charge control circuit for controlling input power which is input to a lithium ion battery via an AC adapter; and a radio circuit for controlling output power which is output from the lithium ion battery and discharging the lithium ion battery, wherein when the lithium ion battery reaches a fully charged state, the radio circuit starts discharging while the charge control circuit stops charge of the lithium ion battery using the AC adapter, and when the lithium ion battery reaches a predetermined charged state, the charge control circuit starts charge of the lithium ion battery using the AC adapter while the radio circuit stops discharge of the lithium ion battery.

6 Claims, 12 Drawing Sheets

OTHER PUBLICATIONS

Kim et al., Analysis of Heat Dissipation in Li-Ion Cells & Modules for Modeling of Thermal Runaway, The 3rd International Symposium on Large Lithium Ion Battery Technology and Application, pp. 1-29, May 2007.*

Kozuka et al., Development of on-line battery testing technology, 19th International Telecommunications Energy Conference, pp. 397-402, Oct. 1997.*

Tsujikawa et al., Development of VRLA battery capacity estimation system, 29th International Telecommunications Energy Conference, pp. 788-793, Oct. 2007.*

BT2000 Custom-Designed Multi-Channel Battery Testing System, available at http://web.archive.org/web/20070508072210/http://arbin.com/Download/products/bt2000.pdf on Oct. 24, 2007.*

Arbin-010 MITS Pro 4.0-BT2000 User Manual, available at http://web.archive.org/web/20070508082125/http://arbin.com/Download/support/MITSPro4.0-BT2000.pdf on Oct. 24, 2007.*

Guena et al., How Depth of Discharge Affects the Cycle Life of Lithium-Metal-Polymer Batteries, 28th Annual International Telecommunications Energy Conference, 2006, INTELEC '06, pp. 1-8, Sep. 2006.*

Extended European Search Report issued Nov. 4, 2010, in Patent Application No. 08171911.4.

T.L. Chern, et al., "The Research of Smart Li-ion Battery Management System", Second IEEE Conference on Industrial Electronics and Applications, XP31137752, May 1, 2007, pp. 2273-2277.

Kazuhiko Takeno, et al., "Influence of cycle capacity deterioration and storage capacity deterioration on Li-ion batteries used in mobile phones", Journal of Power Sources, vol. 142, No. 1-2, XP4812984, Mar. 24, 2005, pp. 298-305.

T. Guena, et al., "How Depth of Discharge Affects the Cycle Life of Lithium-Metal-Polymer Batteries", Annual International Telecommunications Energy Conference, $28^{th}$, IEEE, XP31020314, Sep. 1, 2006, pp. 1-8.

Masahiro Ichimura, et al., "Synergistic Effect of Charge/Discharge Cycle and Storage in Degradation of Lithium-ion Batteries for Mobile Phones", Telecommunications Conference, XP31063288, Sep. 1, 2005, pp. 245-250.

Isidor Buchmann, "Choosing a Battery that will Last. Cycle Life of Various Battery Systems", Battery Conference on Applications and Advances IEEE, XP10352795, Jan. 12, 1999, pp. 365-368.

Kazuhiko Takeno, et al., "Quick testing of batteries in lithium-ion battery packs with impedance-measuring technology", Journal of Power Sources, vol. 128, XP4493641, Mar. 29, 2004, pp. 67-75.

Office Action issued Jan. 27, 2011, in China Patent Application No. 200810185663.X (with English translation).

Japanese Office Action issued Oct. 25, 2011, in Patent Application No. 2007-327661 (with English-language translation).

Office Action issued Jun. 29, 2011, in Korean Patent Application No. 10-2008-0127801 (with English-language translation).

Chinese Office Action issued Feb. 13, 2012, in Patent Application No. 200810185663.X (with English-language translation).

Korean Office Action mailed Apr. 20, 2012 in Japanese Patent Application No. 10-2008-0127801 (with English translation).

Korean Office Action mailed Mar. 31, 2012 in Japanese Patent Application No. 10-2008-0127801 (with corrected English translation).

* cited by examiner

BATTERY TESTING DEVICE AND BATTERY TESTING METHOD

BACKGROUND OF THE INVENTION

1. Field of the Invention

The present invention relates to a battery testing device and a battery testing method for testing a chargeable secondary battery by applying a load, by performing charging using a charging means to charge the secondary battery and discharging of this secondary battery.

2. Related Background Art

Figure 1:
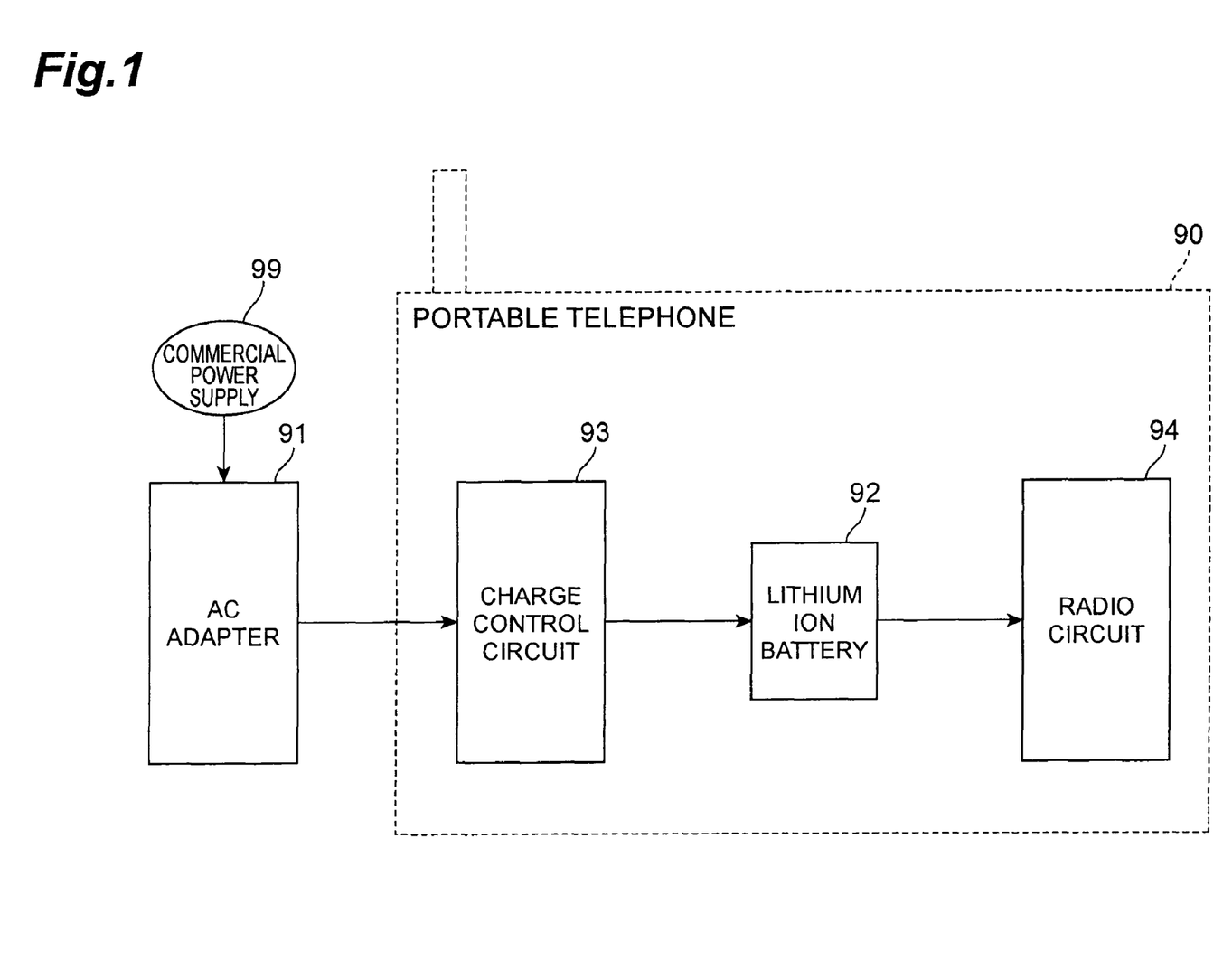
FIG. 1 is a diagram depicting a state when an AC adapter is connected to a portable telephone.

As a multimedia function (e.g. transmission/reception of mail and viewing TV) of portable telephones, there is a format to use a portable telephone while simultaneously being recharged by connecting a charger (that is, and AC adapter) as shown in FIG. 1 in order to enable lengthy use of the portable telephone. FIG. 1 is a block diagram depicting a state when an AC adapter 91 is connected to a portable telephone 90. The AC adapter 91 is also connected to a commercial power supply 99. A portable telephone 90 encloses a lithium ion battery 92 as a secondary battery pack, a charge control circuit 93, and a radio circuit 94 as a load device to discharge the battery, in many cases.

A tendency of a lithium ion battery 92 enclosed in many electronic equipment, including portable telephones 90, which occurs depending on the state of use of the electronic equipment (e.g. charging frequency, number of times of use, ambient temperature during uses) is that the battery capacity decreases (that is capacity deterioration of the battery) or the thermal stability of the materials inside the battery (that is active materials) drops, the thermo-runaway easily occurs when the temperature inside the battery becomes high.

Figure 2:
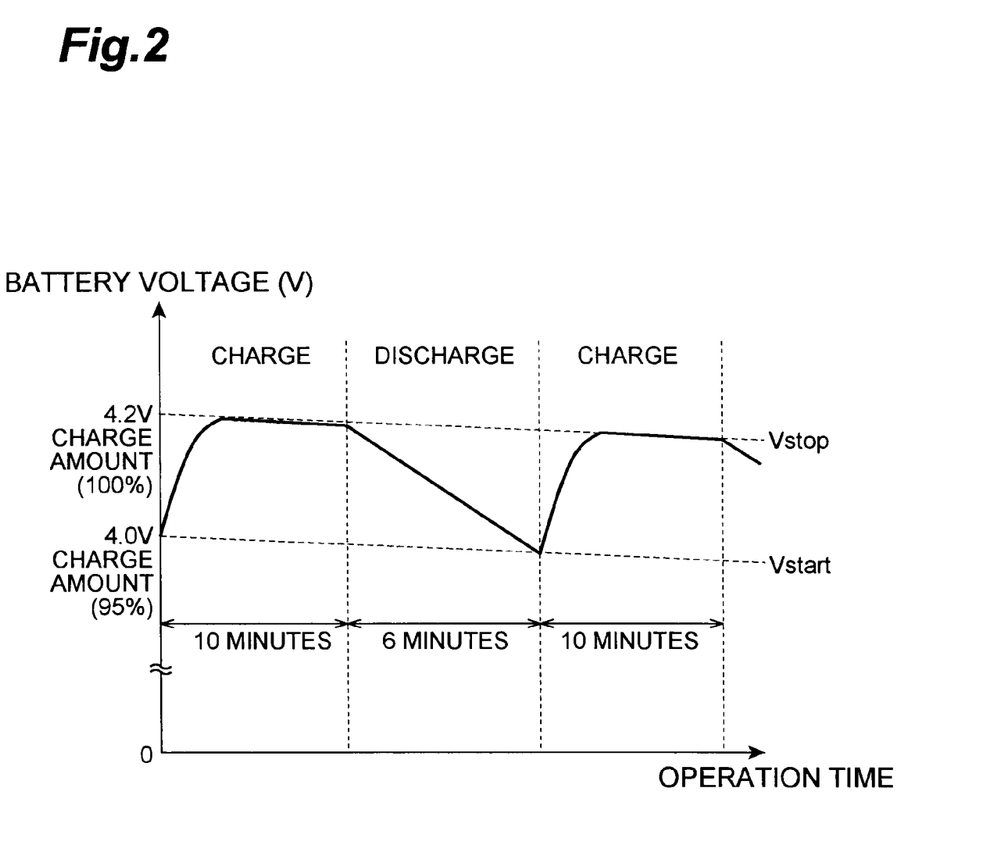
FIG. 2 is a graph showing an example of the change of battery voltage when charge and recharge are repeated in a lithium ion battery being connected for charging.

For example, in a case of using a portable telephone 90 while being charged by being connected to an AC adapter, as mentioned above, charge and discharge are repeated in a highly charged state where the voltage is in about a 4.0 V to 4.2 V range, as shown in FIG. 2, so the charge amount required for a 100% chargeable amount gradually decreases, and the capacity deterioration of the lithium ion battery 92 as the secondary battery progresses. FIG. 2 is a graph showing an example of the change of battery voltage when charge and discharge are repeated in the lithium ion battery 92 being connected for charging. In the case of using [the equipment] while being connected for charging like this, when charging completes, the power required for activating the above mentioned radio circuit 94 is discharged from the above mentioned radio circuit is discharged from the lithium ion battery 92 to the radio circuit 94. As a result, battery voltage drops, and charge is restarted when [the battery voltage] reaches the recharge start voltage Vstart (e.g. about 4.0 V in FIG. 2), and this cycle is repeated.

Conventionally a test to evaluate the performance of the secondary battery, such as the degree of the above mentioned capacity deterioration of a secondary battery, a complete discharge (that is a 100% discharge) of the secondary battery and a complete charge (that is a 100% charge) are regarded as one cycle, and a test to evaluate the performance of the secondary battery is performed by repeating this cycle. This battery performance test is performed by using a test device disclosed in Japanese Patent Application Laid-Open No. H8-136600, for example.

However in this conventional battery performance test, the actual case of using a portable telephone while being charged by being connected to an AC adapter, as mentioned above, is not considered, therefore a better result than actual performance is exhibited in this conventional battery performance test, and the performance of the secondary battery cannot be evaluated accurately.

SUMMARY OF THE INVENTION

With the foregoing in view, it is an object of the present invention to provide a battery testing device and battery testing method for testing the performance of the secondary battery in a portable telephone being connected for charging, by applying a load of performing charge and discharge of the secondary battery conforming to the actual way of use of the portable telephone.

To achieve the above object, a battery test device according to the present invention is a battery testing device which can charge a chargeable secondary battery by using charging means for charging the secondary battery, the device comprising: input control means for controlling the input power which the charging means inputs to the secondary battery; and output control means for controlling the output power which is output from the secondary battery, and discharging the secondary battery, wherein when the secondary battery reaches a fully charged state, the output control means starts discharging the secondary battery while the input control means stops charging the secondary battery using the charging means, and when the secondary battery reaches a predetermined charged state, the input control means starts charging the secondary battery using the charging means while the output control means stops discharging the secondary battery.

In the battery testing device according to the present invention, when the secondary battery reaches the fully charged state, the output control means starts discharging the secondary battery while the input control means stops charging the secondary battery using the charging means, and when the secondary battery reaches a predetermined charged state, the input control means starts charging the secondary battery using the charging means while the output control means stops discharging the secondary battery. Thereby the discharge of the secondary battery starts when the secondary battery reaches the fully charged state, and the charge of the secondary battery starts when the secondary battery reaches the predetermined charged state, and this cycle is repeated. Therefore load is applied to a portable telephone by performing the charge and discharge of the secondary battery conforming to the actual way of use of the portable telephone, such as using the portable telephone while being connected to such charging means as an AC adapter for charging, thereby the performance of the secondary battery in the portable telephone being connected for charging can be correctly evaluated.

It is preferable that the output control means discharges the secondary battery until reaching a state of 95% of battery capacity in fully charged state when the secondary battery reaches the fully charged state. Since charge and discharge are repeated in the fully charged state and highly charged state of 95% of battery capacity in the fully charged state, capacity deterioration of the secondary battery progresses more quickly. Hence performance of the secondary battery can be accurately evaluated in a shorter time.

It is preferable that [the battery testing device] further has temperature adjustment means for adjusting the temperature of the secondary battery, wherein the input control means controls the input power which is input to the secondary battery at a temperature adjusted by the temperature adjustment means, using the charging means, and the output control means discharges the secondary battery by controlling the output power which is output from the secondary battery at a temperature adjusted by the temperature adjustment means. Thereby input power control and output power control are performed for the secondary battery at a temperature adjusted by the temperature adjustment means. Hence the influence of temperature on performance of the secondary battery can be more accurately evaluated.

It is preferable that the temperature adjustment means makes an adjustment to hold the temperature of the secondary battery at 50° C., the input control means controls the input power, which is input in use of the charging means, to the secondary battery at 50° C. adjusted by the temperature adjustment means, and the output control means discharges the secondary battery by controlling the output power which is output from the secondary battery at 50° C. adjusted by the temperature adjustment means. Thereby input power control and output power control are performed for the secondary battery at 50° C. adjusted by the temperature adjustment means. Hence the influence of 50° C., a relatively high temperature, on the performance of the secondary battery can be more accurately evaluated.

It is preferable that the temperature adjustment means makes an adjustment to hold the temperature of the secondary battery at 150° C. for three hours when the battery capacity of the secondary battery reaches a predetermined capacity by a repeat of the discharge of the secondary battery by the output control means and the charge of the secondary battery using the charging means by the input control means. Thereby the temperature of the secondary battery is held at 150° C. for three hours when the battery capacity reaches a predetermined capacity by a repeat of the discharge and charge of the secondary battery. Hence the state of the secondary battery under such an environment can be evaluated.

It is preferable that the temperature adjustment means makes an adjustment to hold the temperature of the secondary battery at 150° C. for three hours when the battery capacity of the secondary battery reaches 75%, 50% or 25% of the battery capacity of an unused secondary battery of the same type as the secondary battery, by a repeat of the discharge and charge of the secondary battery. Thereby the temperature of the secondary battery is held at 150° C. for three hours when the battery capacity reaches 75%, 50% or 25% of the battery capacity of the unused secondary battery by a repeat of the discharge and charge of the secondary battery. Hence the state of the secondary battery under such an environment can be evaluated.

It is indispensable that the temperature adjustment means determines whether the temperature of the secondary battery rises to 160° C. or more while holding the temperature of the secondary battery at 150° C. for three hours, and displays the result of this determination on a external device. Thereby for the secondary battery which rises to 160° C. or higher temperature state because of the sudden start of a thermo-runaway due to the start of thermal decomposition of the battery materials at around 150° C., it can be decided whether thermal decomposition started, and the determination result can be displayed, whereby whether the secondary battery has risen to 160° C. or more can be evaluated.

To achieve the above object, a battery testing method according to the present invention is a battery testing method which can charge a chargeable secondary battery by using charging means for charging the secondary battery, the method having: an input control step of controlling the input power which the charging means inputs to the secondary battery, and an output control step of controlling the output power which is output from the secondary battery and discharging the secondary battery, wherein when the secondary battery reaches a fully charged state, the discharge of the secondary battery is started in the output control step while stopping the charge of the secondary battery using the charging means in the input control step, and when the secondary battery reaches a predetermined charged state, the charge of the secondary battery using the charging means is started in the input control step while stopping the discharge of the secondary battery in the output control step.

In the battery testing method according to the present invention, when the secondary battery reaches the fully charged state, the discharge of the secondary battery is started in the output control step while stopping the charge of the secondary battery using the charging means in the input control step, and when the secondary battery reaches a predetermined fully charged state, the charge of the secondary battery using the charging means is started in the input control step while the discharge of the secondary battery is stopped in the output control step. Whereby the discharge of the secondary battery starts when the secondary battery reaches the fully charged state, and the charge of the secondary battery starts when the secondary battery reaches the predetermined charged state, and this cycle is repeated. Therefore load is applied to a portable telephone by performing the charge and discharge of the secondary battery conforming to the actual way of use of the portable telephone, such as using the portable telephone while being connected to such charging means as an AC adapter for charging, thereby the performance of the secondary battery in the portable telephone being connected for charging can be correctly evaluated.

According to the present invention, a battery testing device and battery testing method which allows accurately evaluating the performance of a secondary battery in a portable telephone being connected for charging, by applying a load of performing the charge and recharge of the secondary battery conforming to the actual way of use of a portable telephone, can be provided.

DESCRIPTION OF THE PREFERRED EMBODIMENTS

Preferred embodiments of the present invention will now be described with reference to the accompanying drawings. In the description of the drawings, the same composing elements are denoted with the same symbols, for which redundant description is omitted.

Figure 3:
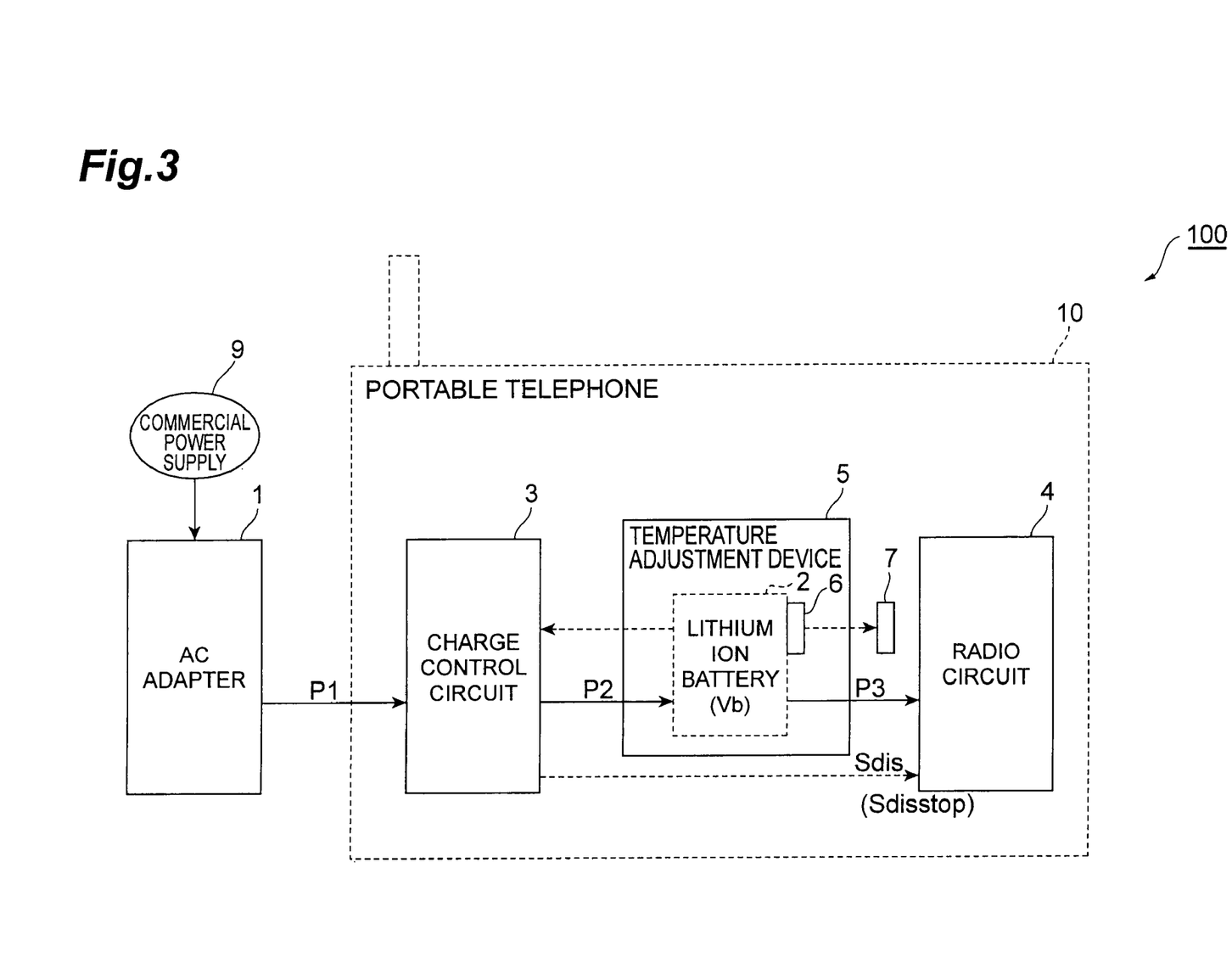
FIG. 3 is a diagram depicting a configuration of a battery testing device.

First a configuration of a battery testing device 100 according to the present embodiment will be described with reference to FIG. 3. FIG. 3 is a diagram depicting the configuration of the battery testing device 100. The battery testing device 100 is a device for enabling the accurate testing of the performance of a lithium ion battery 2 (secondary battery) being connected for charging by performing the charge using an AC adapter 1 (charging module) for charging the lithium ion battery 2 and the discharge of the lithium ion battery 2 to apply load. The AC adapter 1 is connected to the portable telephone 10 on the one hand, and is connected to a commercial power supply 9 on the other hand. The battery testing device 100 has a charge control circuit 3 (input control module), a radio circuit 4 (output control module) and a temperature adjustment device 5 (temperature adjustment module).

The lithium ion battery 2 is a chargeable secondary battery. Instead of the lithium ion battery 2, a lithium polymer battery may be used as a chargeable secondary battery.

The charge control circuit 3 is a circuit to control the DC power P2 (input power) which is input to the lithium ion battery 2 from the commercial power supply 9 via the AC adapter 1. The control system for DC power P2 by the charge control circuit 3 will be described in detail later. The charge control circuit 3 inputs DC power P2 out of the DC power P1, which is output from the AC adapter 1, to the lithium ion battery 2.

The radio circuit 4 is a circuit that functions as a load device, which controls the output power P3 being output from the lithium ion battery 2, and discharges the lithium ion battery 2. The control system for the output power P3 by the radio circuit 4 will be described in details later. Instead of the radio circuit 4, a circuit to implement the adjustment of load fluctuation (that is, a circuit having resistance load) may be used.

The temperature adjustment device 5 is a device for performing temperature adjustment (including the cooling function and heating function) to hold the temperature (operation temperature) of the lithium ion battery 2 at a predetermined arbitrary temperature. The temperature adjustment device 5 has a thermister 6 and a temperature display device 7. The thermister 6 is a device for measuring the temperature of the lithium ion battery 2. The temperature display device 7 is a device for displaying the temperature of the lithium ion battery 2, measured by the thermister 6.

Now power control methods by the charge control circuit 3 and the radio circuit 4 will be described respectively with reference to FIG. 3. While DC power P2 is being input from the charge control circuit 3 to the lithium ion battery 2 inserted in the battery testing device 100 for charging (input control step), when the lithium ion battery 2 reaches a fully charged state, the charge control circuit 3 stops charging the lithium ion battery 2 using the AC adapter 1, while the charge control circuit 3 sends a discharge start signal Sdis to the radio circuit 4, and the radio circuit 4 which received this signal starts discharging the DC power P3 of the lithium ion battery 2 (output control step).

Then the voltage Vb of the lithium ion battery 2 reaches a predetermined voltage (above mentioned recharge start voltage Vstart) state, the charge control circuit 3 sends a charge stop signal Sdissstop to the radio circuit 4, and the radio circuit 4 which received this signal stops the discharge of the lithium ion battery 2, while the charge control circuit 3 starts charging the lithium ion battery 2 using the AC adapter 1. Here a predetermined voltage (recharge start voltage Vstart) state is a state where the need to start charging the lithium ion battery 2 is generated.

In this way, one discharge of the lithium ion battery 2 by the radio circuit 4 and one charge of the lithium ion battery 2 using the AC adapter 1 by the charge control circuit 3 are regarded as one cycle, and this cycle is repeated.

Figure 4:
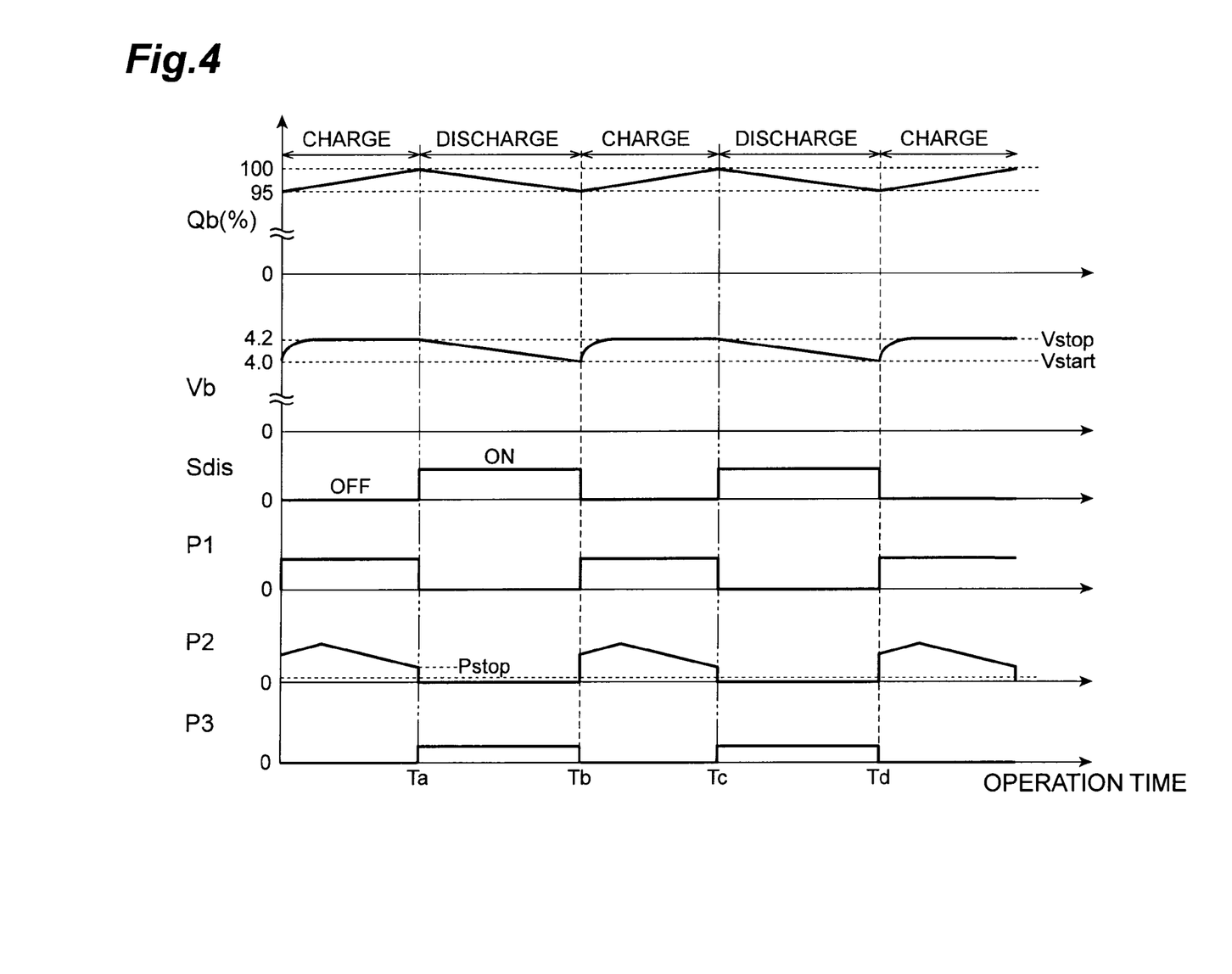
FIG. 4 is a graph describing the change of each index in a battery performance test.

Now the change of each index, such as powers P1 to P3, battery voltage Vb (V) of the lithium ion battery 2 and charge ratio (that is, the charged state) Qb (%), shown in FIG. 3, will be described with reference to FIG. 4. FIG. 4 is a graph depicting the change of each index (operation waveform), where the abscissa indicates the operation time, and the ordinate indicates the magnitude of each index. The battery voltage Vstart in FIG. 4 is a voltage with which the recharge of the lithium ion battery 2 is started, the battery voltage Vstop is a maximum voltage when the lithium ion battery 2 reaches the fully charged state, and power Pstop is the charge stop power to be a timing of the termination of charging the lithium ion battery 2.

First the lithium ion battery 2 is discharged immediately after the lithium ion battery 2 reaches the fully charged state (timing Ta) to be a charge state which is 95% of the battery capacity in the fully charged state (that is, the charge capacity) (timing Tb). In other words, after this discharge period (timing Ta to Tb), 5% of the battery capacity has been discharged (Qb=95%) from the fully charged state (Qb=100%). Discharging the fully charged state by 5% is defined as DOD 5% (DOD: Depth Of Discharge).

Concerning the charging/discharging conditions of the lithium ion battery 2, the recharge start voltage Vstart is about 4.0 V (corresponds to 95% battery capacity), the maximum voltage Vstop in the constant current CC period (maximum voltage when the battery reaches fully charged state) according to the charging method for the lithium ion battery 2 (two-step charging by constant current CC+constant voltage CV) is about 4.2 V, the charge termination power Pstop at the end of the constant voltage CV period is about 0.21 W (=4.2 V×50 mA, where 50 mA is a termination current of a general battery in the constant voltage CV period).

When the voltage of the lithium ion battery 2 drops to about 4.0 V, which is the recharge start voltage Vstart (timing Tb), the recharge control circuit 3 controls the DC power P2, which is input to the lithium ion battery 2 via the AC adapter 1, and starts charging the lithium ion battery 2. Since the voltage of the lithium ion battery 2 increases from about 4.0 V to 4.2 V in the constant current CC period, the DC power P2 value, which is input to the lithium ion battery 2, also increases.

When the voltage of the lithium ion battery 2 is increased to about 4.2 V, [the constant current CC period] shifts to the constant voltage CV period, and the charge control to input DC power P2 to the lithium ion battery 2 is performed while constantly maintaining the voltage to about 4.2 V. At this time, the DC power P2 decreases at a predetermined gradient, and the charge control stops when the DC power P2 reaches the charge termination power Pstop (=0.21 W) (timing Tc). Here the charge control circuit 3 sends the discharge start signal Sdis to the radio circuit 4 (that is, turns ON dis), and the radio circuit 4 which received this signal starts discharge of the power P3 of the lithium ion battery 2. In this discharge period (timings Tc to Td), the battery Vb of the lithium ion battery 2 decreases from about 4.2 V, and when the voltage Vb becomes about 4.0 V, which is the recharge start voltage Vstart (timing Td), the recharge control circuit 3 sends the discharge stop signal Sdisstop to the radio circuit 4 (that is, turns OFF Sdis), and the radio circuit 4 which received this signal stops the discharge of the lithium ion battery 2, while the charge control circuit 3 starts the charge of the lithium ion battery 2 using the AC adapter 1.

In this way, one discharge of the lithium ion battery 2 by the radio circuit 4 and one charge of the lithium ion battery 2 by the charge control circuit 3 using the AC adapter 1 are regarded as one cycle, and this cycle is repeated.

Figure 5:
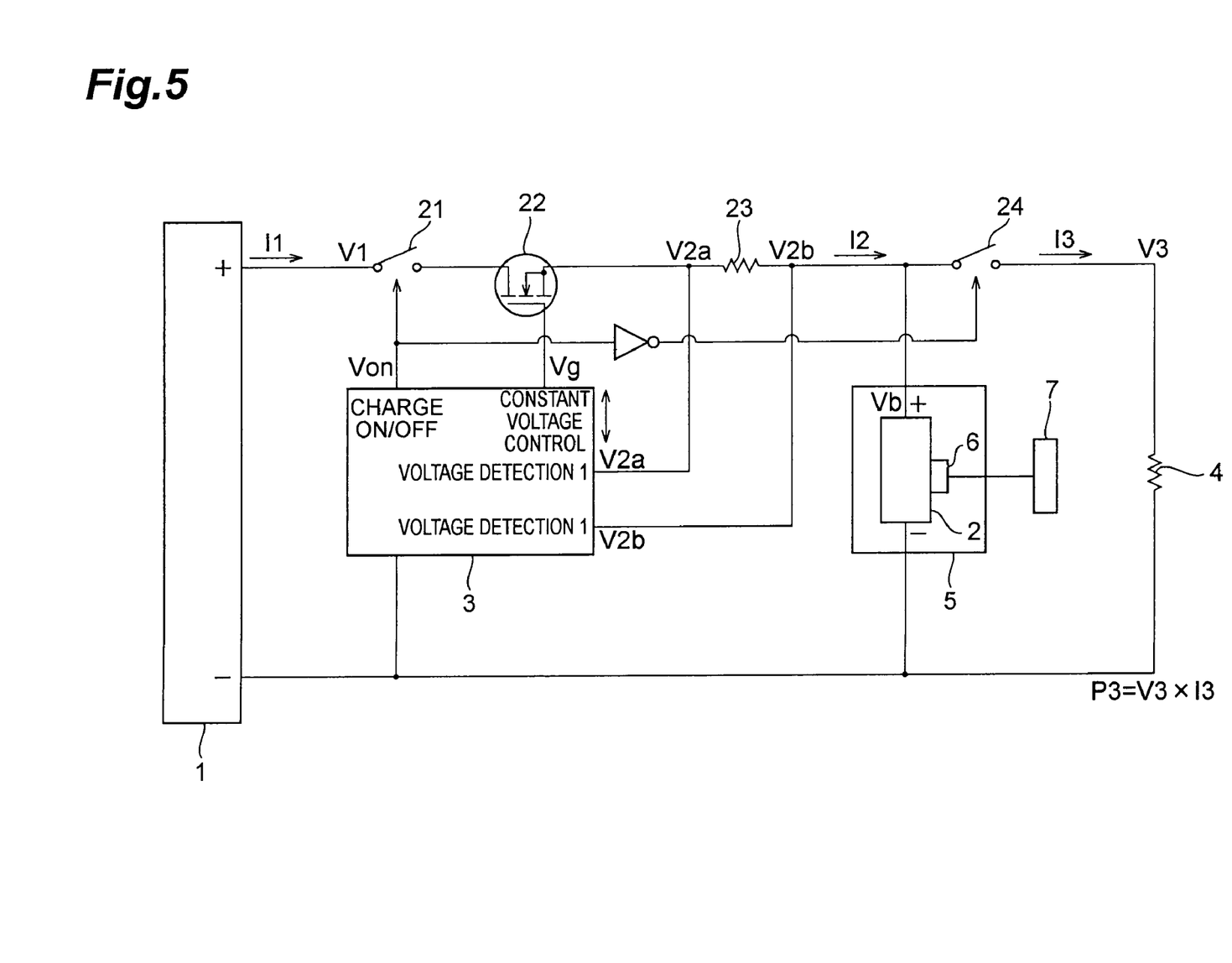
FIG. 5 is a circuit diagram depicting a concrete circuit configuration to implement a configuration of a battery testing device.

Now a concrete circuit configuration to implement the configuration of the battery testing device 100, shown in FIG. 3, will be described with reference to FIG. 5. FIG. 5 is a circuit diagram for depicting the concrete circuit configuration to implement the configuration of the battery testing device 100. In order to implement the configuration of the battery testing device 100, the switches 21 and 24, FET 22 (Field-Effect Transistor) and the current detection resistor 23 are disposed.

Figure 6:
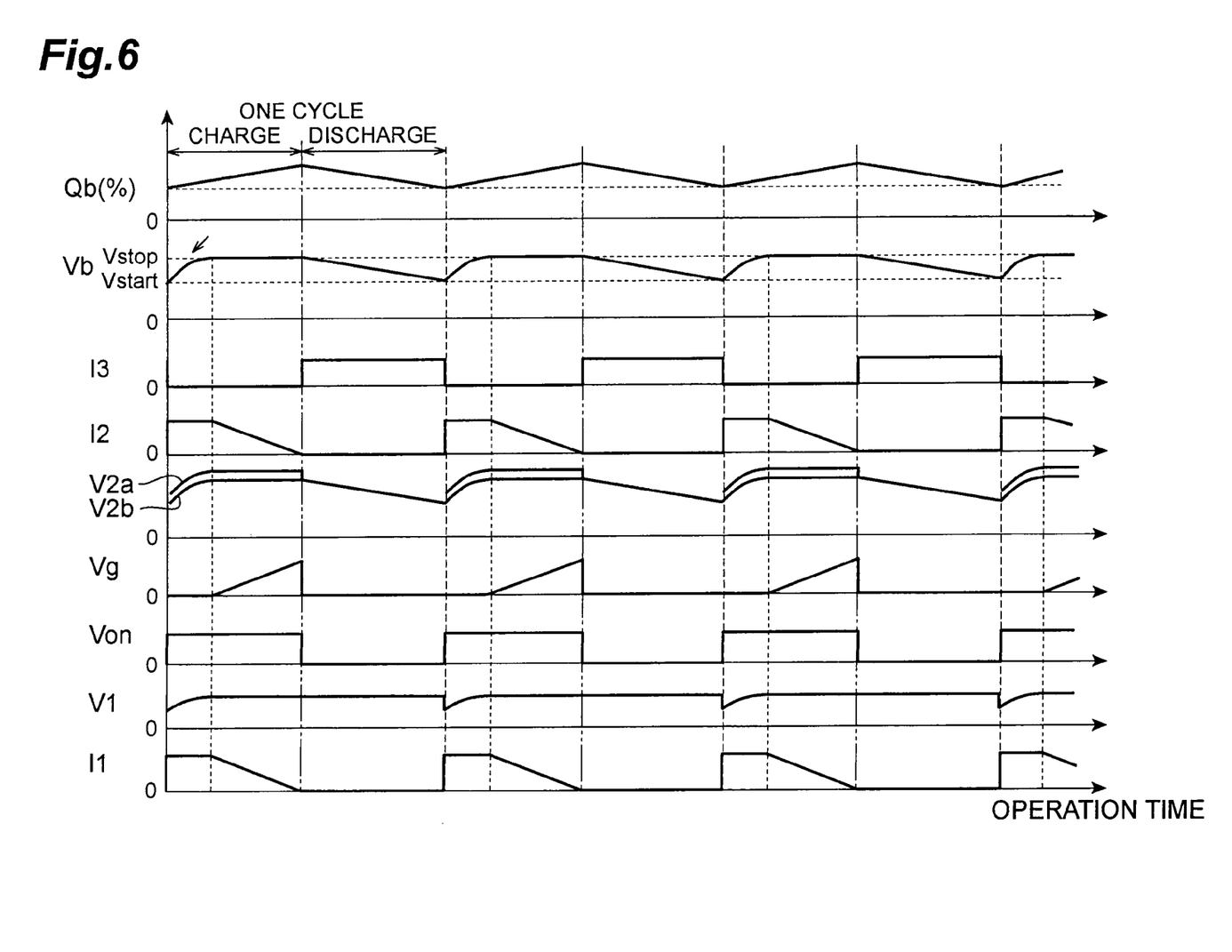
FIG. 6 is a graph depicting the changes of each index according to a concrete circuit configuration to implement the configuration of a battery testing device.

Now the change of each index, such as the currents I1 to I3 (A), the voltages V1, V2a and V2b (V), the battery voltage Vb (V) of the lithium ion battery 2, and the charge ratio (that is, the charged state) Qb (%) shown in FIG. 5 will be described with reference to FIG. 6. FIG. 6 is a graph for describing the change of each index (operation waveform), where the abscissa indicates the operation time, and the ordinate indicates the magnitude of each index. Here the battery voltage Vstart in FIG. 6 is a voltage at which the recharge of the lithium ion battery 2 is started, and the battery voltage Vstop is the maximum voltage at which the lithium ion battery 2 reaches the fully charged state.

Figure 7:
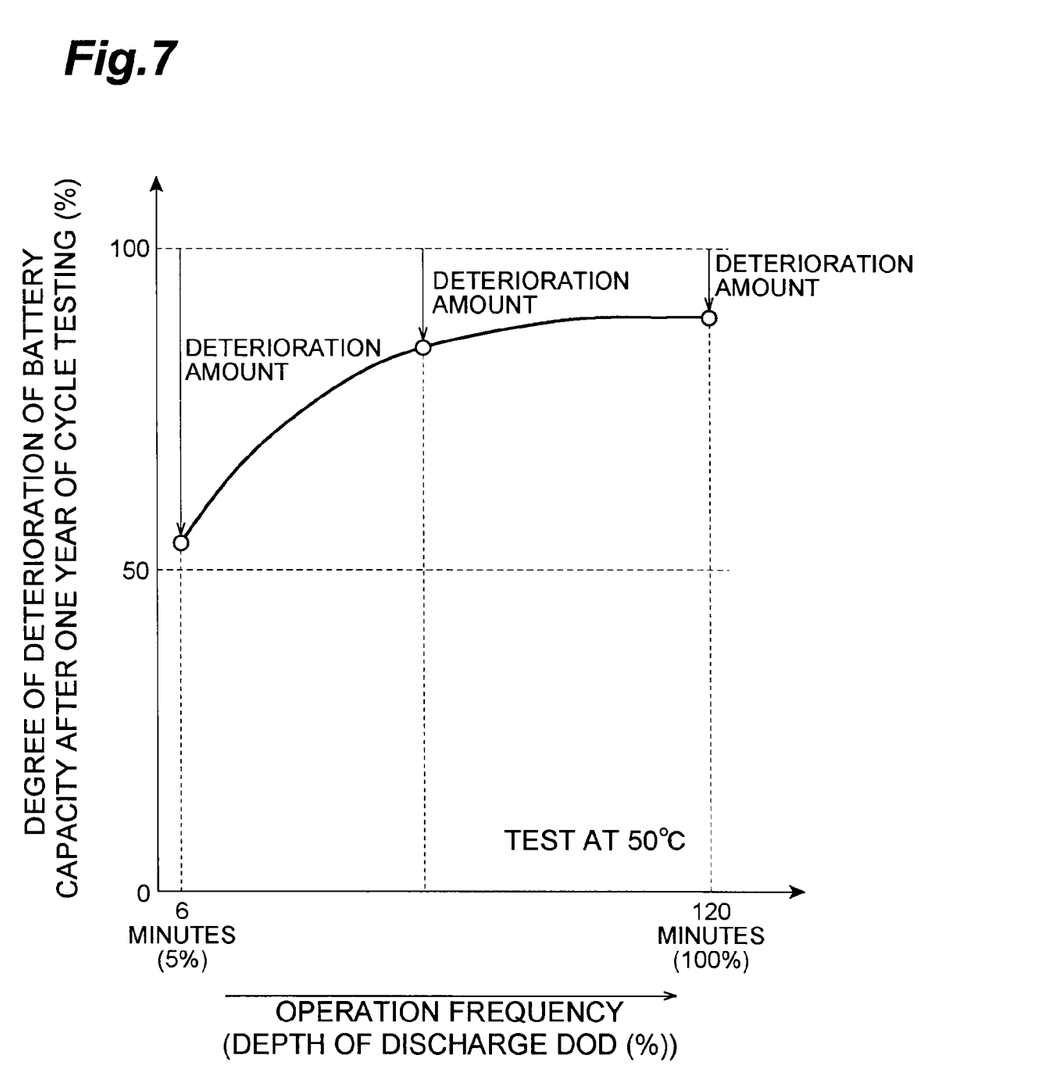
FIG. 7 is a graph depicting the degree of the drop of battery capacity when the cycle test to repeat charge and discharge is performed.

Now the degree of drop of the battery capacity (that is, the capacity deterioration of the battery) when a cycle test to repeat the charge and discharge of the lithium ion battery 2 will be described with reference to FIG. 7. FIG. 7 is a graph depicting the degree of the drop of battery capacity when a cycle test, to repeat charge and discharge, is performed for a year, where the abscissa indicates the depth of discharge (DOD), and the ordinate indicates the deterioration degree (%). Here the temperature of the lithium ion battery 2 is held to about 50° C. using the temperature adjustment device 5, and this temperature is regarded as a test temperature.

FIG. 7 shows the degree of drop of the battery capacity in the cycle test when the depth of discharge (DOD) is constant. For the depth of discharge, values in several steps, from 5% to 100%, are provided, and testing is performed using each of these values. As FIG. 7 shows, the degree of capacity deterioration (that is, the deterioration amount) of the lithium ion battery 2 increases as the depth of discharge (that is, the discharge amount) decreases (that is, as the value becomes closer to 5%). Therefore a lithium ion battery 2, when the cycle test is performed with the depth of discharge as 5% (that is, discharge up to 95% of the battery capacity fully charged state), can be defined as a lithium ion battery 2 having a worst value, with which the capacity deterioration degree becomes the worst.

Figure 8:
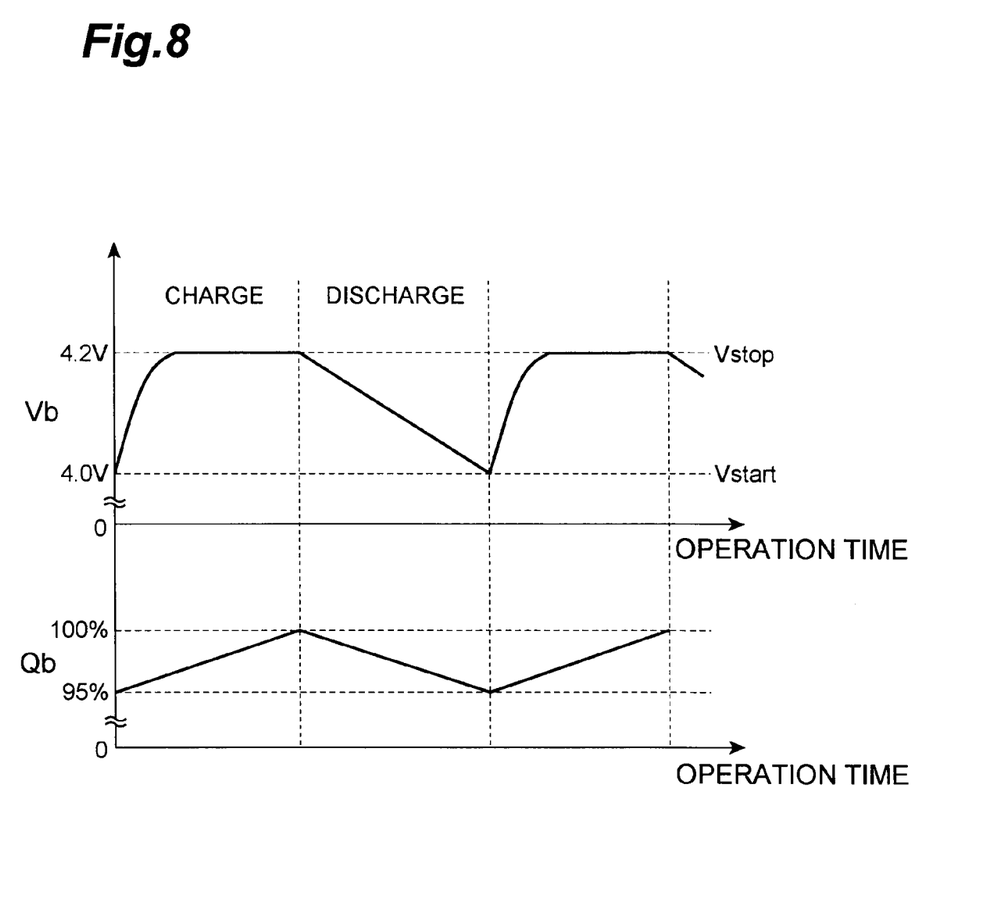
FIG. 8 is a graph depicting the relationship between the battery voltage Vb and the charge ratio Qb of a lithium ion battery.

Now the relationship of the battery voltage Vb (V) of the lithium ion battery 2 and the charge ratio (that is, the charged state) Qb (%) will be described with reference to FIG. 8. FIG. 8 is a graph depicting a relationship of the battery voltage Vb (V) and the charge ratio (that is the charged state) Qb (%) of the lithium ion battery 2, where the abscissa indicates the operation time, and the ordinate indicates the battery voltage Vb and the charge ratio Qb. As FIG. 8 shows, when a voltage Vb (e.g. about 4.0 V) corresponding to the 95% Qb charge ratio (that is, a 5% DOD) is determined, this voltage Vb becomes the recharge start voltage Vstart.

Figure 9:
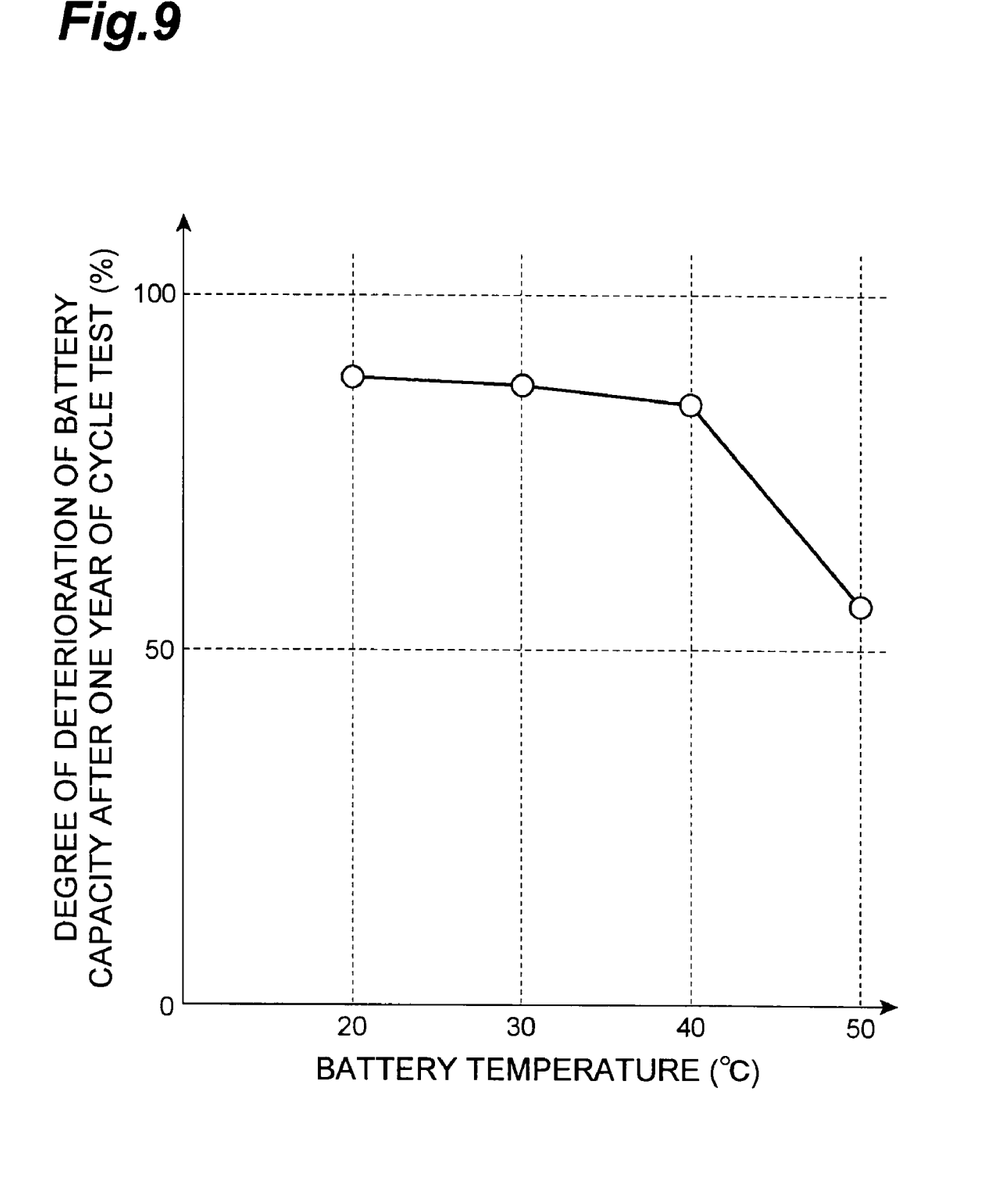
FIG. 9 is a graph depicting the change of degree of the drop of battery capacity based on the temperature change when the cycle test to repeat charge and discharge is performed.

Now the change of degree of the drop of battery capacity (that is, the capacity deterioration of the battery) due to the temperature change, when the cycle test to repeat charge and discharge of the lithium ion battery 2, will be described with reference to FIG. 9. FIG. 9 is a graph depicting the change of degree of drop of battery capacity due to temperature change, when the cyclic test to repeat charge and recharge is performed for one year, where the abscissa indicates the temperature of the lithium ion battery 2, and the ordinate indicates the deterioration degree (%). Here 5% DOD is a test condition, and testing is performed holding the temperature to about 20° C., to about 30° C., to about 40° C. and to about 50° C. respectively. As FIG. 9 shows, when the temperature is increased to about 20° C., to about 30° C. and to about 40° C. respectively, the capacity deterioration of the battery progresses little, but in the case of about 50° C., the capacity deterioration of the battery suddenly progresses. Hence the capacity deterioration of the battery can rapidly progress by testing the lithium ion battery 2 with holding the temperature to about 50° C.

Figure 10:
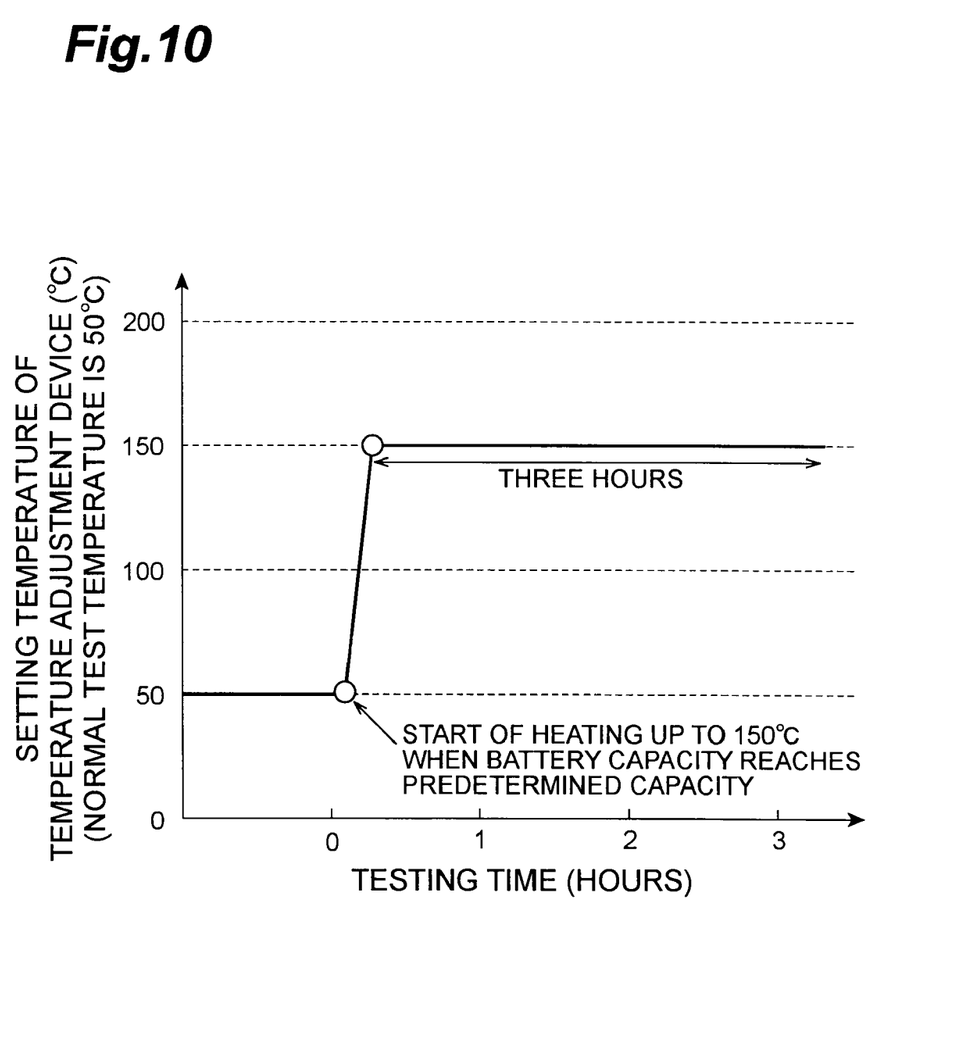
FIG. 10 is a graph depicting the temperature change of the lithium ion battery based on the change of test time when the cycle test to repeat charge and discharge is performed.

Now the temperature change of the lithium ion battery 2 due to the change of test time when the cycle test to repeat charge and discharge of the lithium ion battery 2 is performed will be described with reference to FIG. 10. FIG. 10 is a graph depicting the temperature change of the lithium ion battery 2 due to the change of test time when the cycle test to repeat charge and discharge is performed, where the abscissa indicate the test time, and the ordinate indicates the setting temperature by the temperature adjustment device 5. In this case, when the battery capacity of the lithium ion battery 2 deteriorates to a predetermined ratio (e.g. 75%) of the battery capacity of the lithium ion battery 2 that is not in use (100%), the temperature adjustment device 5 increases the temperature of the lithium ion battery 2 from about 50° C., which is a normal test temperature, to about 150° C., and then holds [temperature at about 150° C.] for three hours. Here the case when the temperature of the lithium ion battery 2 spontaneously changes will be described later.

Figure 11:
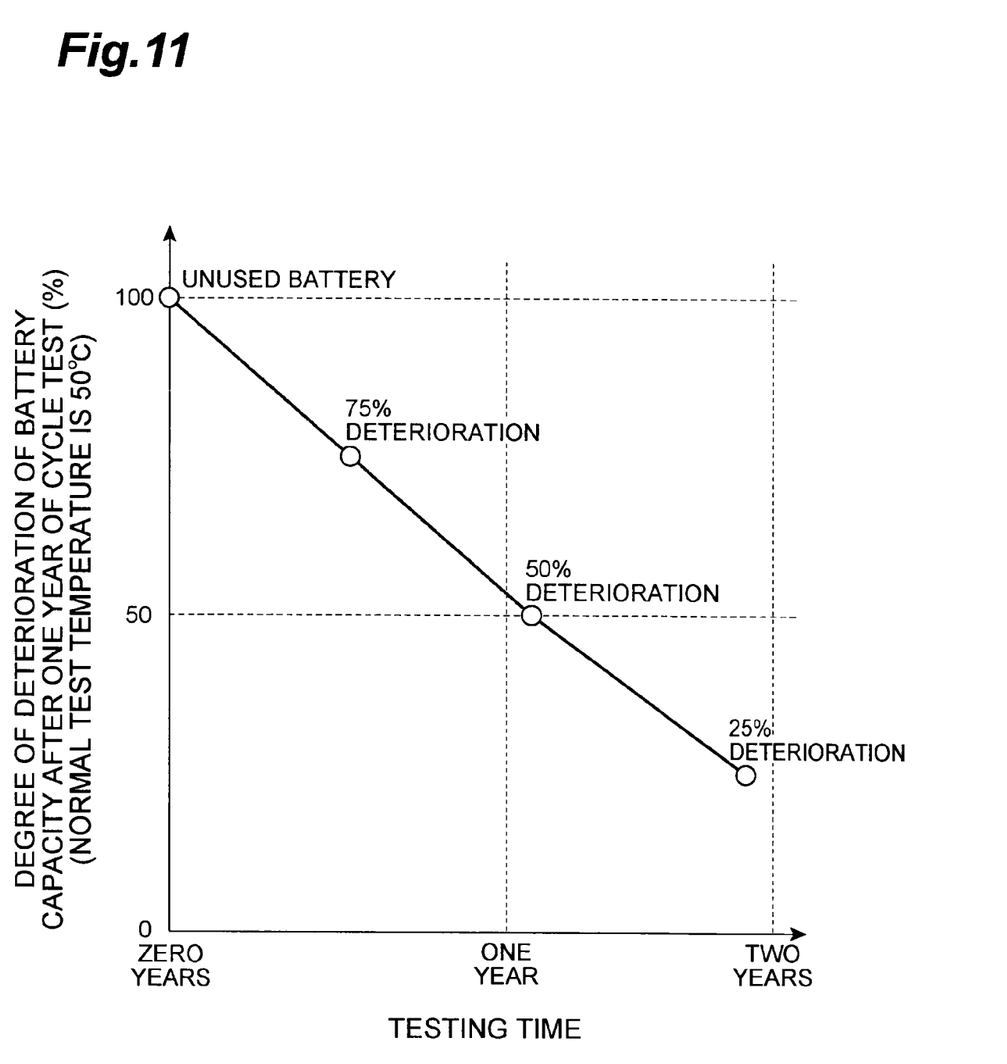
FIG. 11 is a graph depicting the change of battery capacity of the lithium ion battery based on the change of test time when the cycle test to repeat charge and discharge is performed.

Now the change of battery capacity of the lithium ion battery 2 due to the change of test time when the cycle test to repeat charge and discharge of the lithium ion battery 2 will be described with reference to FIG. 11. FIG. 11 is a graph depicting a change of battery capacity of the lithium ion battery 2 due to the change of test time when the cycle test to repeat charge and discharge is performed, where the abscissa indicates the test time, and the ordinate indicates the setting temperature by the temperature adjustment device 5. Here 5% DOD is the test condition, and the test is performed with holding the temperature at about 50° C. After the battery capacity of the lithium ion battery 2 reaches 75%, 50% or 25% of the battery capacity of the lithium ion battery which is the same type and same model of this lithium ion battery 2 and is not used (new product and same type), the temperature adjustment device 5 makes an adjustment so that the temperature of the lithium ion battery 2 is held at about 150° C. for three hours.

As FIG. 11 shows, if about half a year has elapsed from the unused battery state (100% battery capacity), then the battery capacity deteriorates to 75% of the battery capacity in the fully charged state, then if about one year has elapsed from the unused battery state, the battery capacity deteriorates to 50% of the battery capacity in the fully charged state, and if about two years have elapsed from the unused battery state, the battery capacity deteriorates to 25% of the battery capacity in the fully charged state. This means that the degree of capacity deterioration of the battery can be adjusted by adjusting the test time.

Figure 12:
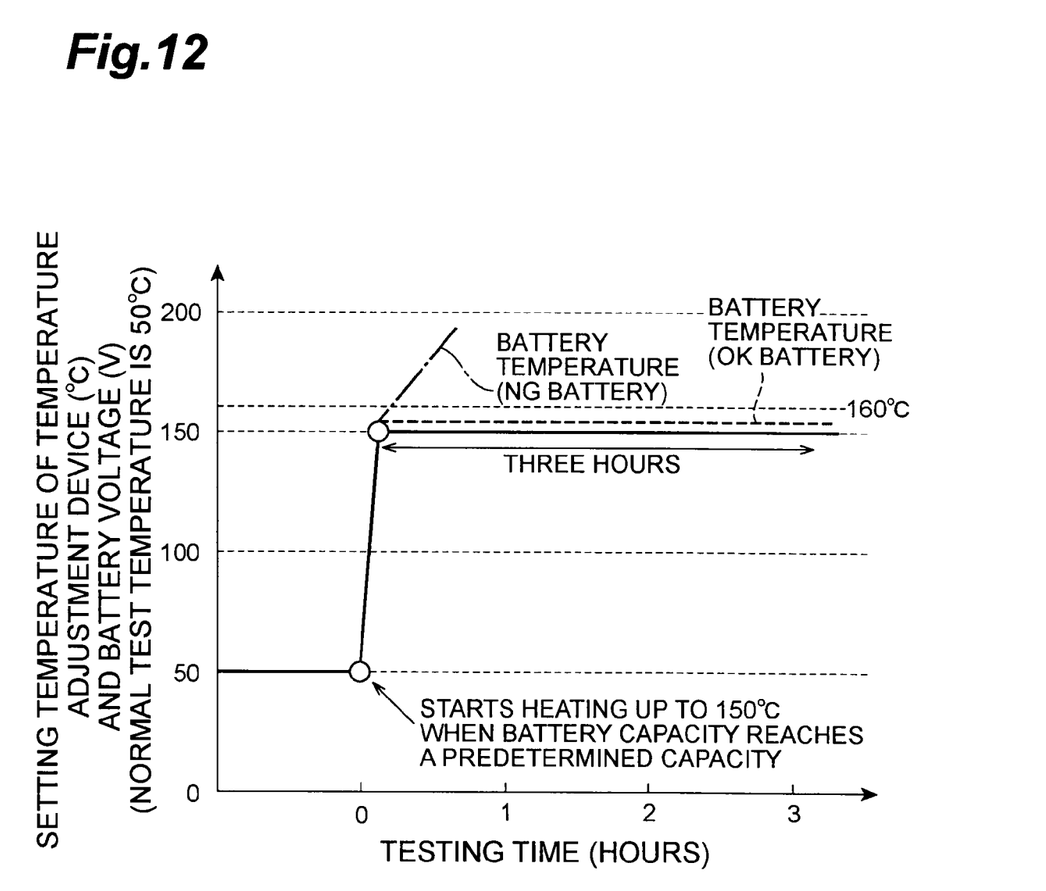
FIG. 12 is a graph depicting the temperature change of the lithium ion battery based on the change of test time when the cycle test to repeat charge and discharge is performed.

Now the temperature change of the lithium ion battery 2 due to the change of test time when the cycle test to repeat charge and discharge of the lithium ion battery 2 will be described with reference to FIG. 12. FIG. 12 is a graph depicting a temperature change of the lithium ion battery 2 due to the change of test time when the cycle test to repeat charge and discharge is performed, where the abscissa indicates the test time, and the ordinate indicates the setting temperature by the temperature adjustment device 5 and the battery voltage. Here when the battery capacity of the lithium ion battery 2 deteriorate to 75%, 50% or 25% of the charged state of the battery capacity in an unused state (100%), the temperature adjustment device 5 increases the temperature of the lithium ion battery 2 from about 50° C., which is the normal test temperature, to about 150° C., and then holds [the temperature at about 150° C.] for three hours.

While holding the temperature of the lithium ion battery 2 at about 150° C. for three hours, the temperature adjustment device 5 judges whether the temperature of the lithium ion battery 2 increases to about 160° C. or more using the thermister 6. The temperature adjustment device 5 distinguishes a lithium ion battery 2 of which temperature is increased to about 160° C. or more as an NG battery which is not appropriate to be used for a portable telephone 10, and displays this information on the temperature display device 7, and distinguishes a lithium ion battery 2 of which temperature does not increase to about 160° C. or more (that is, increases to a temperature less than about 160° C.) as an OK battery which is appropriate to be used for a portable telephone 10, and displays this information on the temperature display device 7.

Thereby a non-defective battery (OK battery) of which temperature does not increases to about 160° C. or more even if [the battery] heats up to about 150° C. can be selected from the lithium ion batteries 2 of which capacity deteriorated to 75%, 50% or 25% of the battery capacity in an unused state. In the case of a lithium ion battery 2 having a battery capacity in an unused state (100%), heating to about 150° C. is performed immediately, and in the case of a lithium ion battery 2 of which battery capacity is 75% or less of the battery capacity in an unused state, heating is started when the battery capacity becomes a predetermined value.

Concerning the thermal stability of the lithium ion battery 2, a current lithium ion battery sometimes becomes about a 160° C. or higher temperature state when heated to about 150° C., since the thermal decomposition of the battery materials starts and thermo-runaway suddenly begins. Therefore it is a critical safety confirmation for a lithium ion battery 2 to check that this thermal decomposition and thermo-runaway is not generated even if [the battery] heats up to about 150° C. (that is, a temperature threshold, at which thermal decomposition and thermo-runaway occurs, does not drop). A case of the lithium ion battery 2 becoming about 150° C. is a case of internal failure, such as a short, occurring to the lithium ion battery 2 or a case of the lithium ion battery 2 externally being heated (dropping into hot tempura oil or being left in a car on a hot summer day).

As described above, according to the battery testing device 100 of the present invention, if the lithium ion battery 2 reaches a fully charged state, the charge control circuit 3 stops charging the lithium ion battery 2 using the AC adapter 1, while the radio circuit 4 starts discharging the lithium ion battery 2, and when the lithium ion battery 2 reaches a predetermined charged state, the radio circuit 4 stops discharging the lithium battery 2, while the charge control circuit 3 starts charging the lithium ion battery 2 using the AC adapter 1.

Thereby when the lithium ion battery 2 reaches the fully charged state, a discharge of the lithium ion battery 2 starts, and when the lithium ion battery 2 reaches a predetermined charged state, charge of the lithium ion battery 2 starts, and this cycle is repeated. Therefore the performance of the lithium ion battery 2 in a portable telephone 10 being connected for charging can be more accurately evaluated by applying a load of charging and discharging the lithium ion battery 2 conforming to the actual way of use, such as using the portable phone 10 while being charged via the AC adapter 1, for example. Thereby a test to evaluate performance using the lithium ion battery 2 in this state becomes possible. Also input power control and output power control for the lithium ion battery 2 at a temperature adjusted by the temperature adjustment device 5 are performed. Hence the influence of temperature on the performance of the lithium ion battery 2 can be accurately evaluated. Thereby a test to evaluate performance using the lithium ion battery 2 in this state can be performed.

In the actual operation of the portable telephone 10, the charge period and discharge period overlap, but in the present embodiment, the charge period and discharge period are separated and modeled to be equivalent, as mentioned above. In other words, in the lithium ion battery 2, the charge mode and discharge mode are separated, and [the lithium ion battery 2] is operated only in one of these modes at a time, so the operation pattern is specified such that the charge mode and discharge mode are separated.

What is claimed is:

1. A battery testing device that charges a chargeable secondary battery by using a charging module, comprising:
   an input control module that controls an input power that the charging module inputs to the secondary battery;
   an output control module that controls an output power that is output from the secondary battery and discharges the secondary battery;
   a temperature adjustment device configured to heat and cool the secondary battery, the temperature adjustment device configured to increase the temperature of the secondary battery from a first temperature of about 50° C. to a second temperature of about 150° C. for a period of about 3 hours when a battery capacity of the secondary battery falls below a threshold,
   wherein the temperature adjustment device judges whether the temperature of the secondary battery rises to 160° C. or more while performing adjustment to hold the temperature of the secondary battery at the second temperature, and displays a result of the judgment on an external device,
   wherein the input control module and the output control module are configured to cyclically perform a plurality of charge/discharge cycles, and
   each charge/discharge cycle includes:
      when the secondary battery reaches a fully charged state, the output control module starts discharging the secondary battery while the input control module stops charging the secondary battery using the charging module, and
      when the secondary battery reaches a predetermined charged state, the input control module starts charging the secondary battery using the charging module while the output control module stops discharging the secondary battery.

2. The battery testing device according to claim 1, wherein the output control module discharges the secondary battery until reaching a state of 95% of the battery capacity in the fully charged state when the secondary battery reaches the fully charged state.

3. The battery testing device according to claim 1, wherein the input control module controls the input power that is input to the secondary battery at the temperature adjusted by the temperature adjustment device, using the charging module, and the output control module discharges the secondary battery by controlling the output power that is output from the secondary battery at the temperature adjusted by the temperature adjustment device.

4. The battery testing device according to claim 3, wherein:
the input control module controls the input power, which is input in use of the charging module, to the secondary battery held at the first temperature as adjusted by the temperature adjustment device, and the output control module discharges the secondary battery by controlling the output power that is output from the secondary battery held at the first temperature as adjusted by the temperature adjustment device.

5. The battery testing device according to claim 4, wherein the temperature adjustment device makes the adjustment to hold the temperature of the secondary battery at the second temperature for three hours when the battery capacity of the secondary battery reaches 75%, 50% or 25% of a battery capacity of an unused secondary battery of the same type as the secondary battery, by the cyclically performed plurality of charge/discharge cycles of the secondary battery.

6. A battery testing method that charges a chargeable secondary battery by using a charging module, comprising:
controlling an input power that the charging module inputs to the secondary battery; and controlling an output power that is output from the secondary battery and discharges the secondary battery; and increasing a temperature of the secondary battery from a first temperature of about 50° C. to a second temperature of about 150° C. for a period of about 3 hours when a battery capacity of the secondary battery falls below a threshold, judging whether the temperature of the secondary battery rises to 160° C. or more while performing adjustment to hold the temperature of the secondary battery at the second temperature, and displaying a result of the judgment on an external device, wherein the controlling an input power and controlling an output power are cyclically performed in a plurality of charge/discharge cycles, and each charge/discharge cycle includes:
when the secondary battery reaches a fully charged state, discharging the secondary battery is started in the controlling an output power, and the controlling an input power is stopped, and when the secondary battery reaches a predetermined charged state, charging the secondary battery using the charging module is started in the controlling an input power, and the controlling an output power is stopped.

* * * * *